United States Patent [19]

Brown, Jr. et al.

[11] 4,185,251
[45] Jan. 22, 1980

[54] COMPENSATED AUTOMATIC GAIN CONTROL

[75] Inventors: William C. Brown, Jr., Littleton; Paul G. Crete, Chelmsford; Philip L. Sullivan, Acton; James Williamson, Franklin, all of Mass.

[73] Assignee: Raytheon Company, Lexington, Mass.

[21] Appl. No.: 912,602

[22] Filed: Jun. 5, 1978

[51] Int. Cl.² ............................................. H03G 3/30
[52] U.S. Cl. ................................... 330/279; 330/110; 330/140; 330/143; 330/289
[58] Field of Search ............... 330/110, 138, 140, 256, 330/279, 289, 143

[56] References Cited

U.S. PATENT DOCUMENTS 3,753,139  8/1973  Spencer ........................... 330/289 X Primary Examiner—James B. Mullins
Attorney, Agent, or Firm—Philip J. McFarland; Joseph D. Pannone

[57] ABSTRACT

Circuitry for compensating for the effects of changes in ambient temperature on an automatic gain control arrangement in a missile-borne receiver is shown to include an operational amplifier responsive only to the level of the output signal from an automatic gain detector and amplifier, such end being effected by using temperature sensitive elements in the input and feedback circuits of the operational amplifier.

4 Claims, 2 Drawing Figures

COMPENSATED AUTOMATIC GAIN CONTROL

The invention herein described was made in the course of, or under a contract or subcontract thereunder, with the Department of Defense.

BACKGROUND OF THE INVENTION

This invention pertains generally to radar receivers used in missile guidance systems and particularly to any receiver, such as a monopulse receiver, which incorporates an automatic gain control arrangement.

It is well known in the art that results obtained with an automatic gain control arrangement (referred to hereinafter simply as AGC) used to maintain the level of the output of an amplifier in a missile-borne radar receiver are affected by any substantial change in ambient temperature. Because the active elements in amplifiers of the type used in radar receivers are usually silicon transistors, two characteristic problems are experienced. Firstly, with an input signal of a given level, the level of the AGC varies inversely with ambient temperature. Secondly, even with a constant ambient temperature, the dynamic range (meaning the range of levels of the input signals within which the level of the output, or AGC, signals is linearly related to the level of the input signals) is relatively restricted.

It will be appreciated that it is not feasible in a missile-borne receiver to maintain the ambient temperature of any AGC arrangement at a predetermined level. That is to say, it is not practical to provide so-called constant temperature ovens because of the weight, physical size and power requirements of such ovens.

In flight testing of guided missiles it is necessary, inter alia, to evaluate the performance of the various AGC arrangements in the missile-borne radar receiver. Obviously, then, some way must be devised to eliminate the effects of changes in ambient temperature in such evaluation.

SUMMARY OF THE INVENTION

Therefore, it is a primary object of this invention to provide, for use in an AGC arrangement, compensating circuitry providing a linear and accurate output voltage that is proportional to input signal level despite wide variations in the ambient temperature.

Another object of this invention is to provide, in the compensating circuitry just mentioned hereinabove, means for extending the dynamic range of an AGC arrangement when the ambient temperature varies within wide limits.

The foregoing and other objects of this invention are attained generally by providing, in an AGC arrangement, compensating circuitry effective over a broad range of ambient temperatures: (a) to maintain, for an input signal with a given level, the level of the output signal from the AGC arrangement; and (b) to maintain a substantially linear proportionality between the levels of the output and input signals as the level of the latter is changed.

BRIEF DESCRIPTION OF THE DRAWINGS

For a more complete understanding of this invention, reference is now made to the following description of the accompanying drawings in which.

DESCRIPTION OF THE PREFERRED EMBODIMENTS

Figure 1:
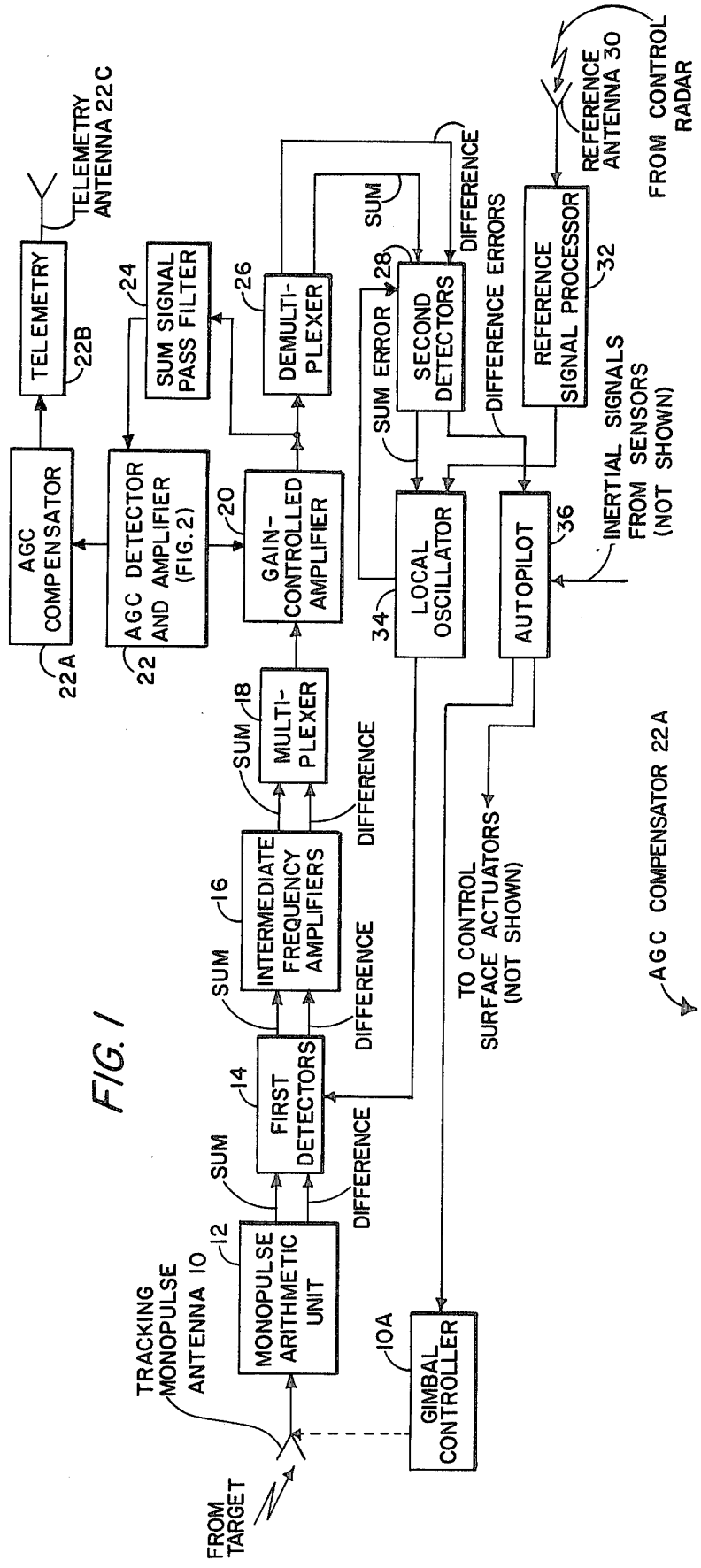
FIG. 1 is a block diagram, greatly simplified, of a missile-borne radar receiver, such diagram showing how the contemplated AGC arrangement may be applied; and, FIG. 2 is a schematic diagram showing the details of the contemplated compensating circuitry.

Before referring to the FIGURES in detail, it should be noted that the application shown in FIG. 1 is exemplary only. That is to say, the contemplated compensating circuitry may be used to improve the operation of any AGC arrangement using solid state silicon amplifiers and subjected to changes in ambient temperature. With the foregoing in mind, it will be recognized that the block diagram of FIG. 1 is a generalized diagram of a missile-borne monopulse receiver and signal processor in a semiactive guidance system. Thus, as is conventional, echo signals from target (not shown) are received by a tracking monopulse antenna 10 to produce, after passing through a monopulse arithmetic unit 12, sum and difference signals which are converted by first detectors 14 to corresponding signals at a selected intermediate frequency. The corresponding signals, after passing through intermediate frequency amplifiers 16, are combined in a multiplexer 18 to allow normalization to be effected in a gain-controlled amplifier 20. The level of that amplifier is controlled by an AGC detector and amplifier 22 in a conventional manner. Suffice it to say here that the AGC detector and amplifier 22 is responsive to the sum signal passed through a sum signal pass filter 24 to cause the level of the multiplexed signal out of the gain-controlled amplifier 20 to be normalized in a conventional fashion. The normalized multiplexed signal is impressed on a demultiplexer 26 to provide separate normalized sum and difference signals which are applied to second detectors 28 which, in turn, finally produce a sum error signal and difference error signals. Such error signals are, respectively, indicative of error in the first local oscillator signal applied to the first detectors 14 and to the so-called line-of-sight error (meaning the angle between the boresight line of the tracking monopulse antenna 10 and the line of sight between such antenna and the target (not shown)). The sum error signal is applied, along with a reference signal (received through a reference antenna 30 and processed in a reference signal processor 32) to the local oscillator 34, thereby properly to control that element. The difference signals are applied, along with appropriate inertial signals, to an autopilot 36, to actuate a gimbal controller 10A and the control surface actuators (not shown). Ultimately then the course of the missile and the orientation of the tracking monopulse antenna 10 are controlled to maintain the rate of the line-of-sight error at zero until intercept.

In order to evaluate the performance during flight of the just described missile-borne receiver and processor means are provided to allow selected signals to be telemetered to a monitoring station (not shown). Thus, when it is desired to evaluate the performance of the AGC arrangement, a portion of the output signal of the AGC detector and amplifier 22 is connected, through an AGC compensator 22A to be described in connection with FIG. 2, to apparatus designated TELEMETRY 22B. The latter is conventional in construction, being operative to modulate a telemetry carrier signal in accordance with the level of the signal out of the AGC compensator 22A for transmission through a telemetry antenna 22C.

Figure 2:
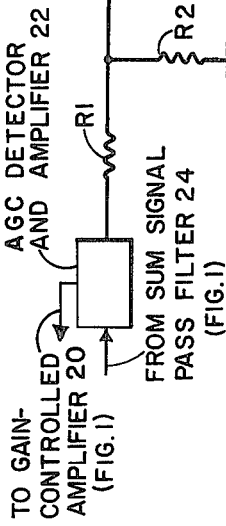

As noted hereinbefore, the level of the signal out of the AGC detector and amplifier 22 is dependent upon both the level of the sum signal passing through the sum signal pass filter 24 and the ambient temperature. Therefore, because the telemetered signal is to be representative of the input signal to the AGC detector and amplifier 22, AGC compensator 22A shown in detail in FIG. 2 is here provided to reduce the effect of any change in ambient temperature within wide limits. Thus, as shown in FIG. 2, the signal out of the AGC detector and amplifier 22 is connected to a voltage divider made up of resistors R1 and R2. The junction of resistors R1 and R2 is connected through a variable resistor R3 and a diode D1 (here a type 1N4148) to a noninverting input terminal (marked "+") of an AGC scaling amplifier 22D. That amplifier here is a type LH2101 operational amplifier manufactured by National Semiconductor, 2900 Semiconductor Drive, Santa Clara, California 95051. The noninverting input terminal "+" is biased through a resistor R4 connected to a −B power source (not shown) which acts as a constant current source. Feedback for the AGC amplifier 22D is accomplished through a variable resistor R5 connected between the output of such amplifer and an inverting input terminal marked "−". The just mentioned terminal is also connected, through a variable resistor R6 and a transistor Q1 (here a type 2N2609 field effect transistor) to ground.

The values and settings of the various resistors are best determined empirically to compensate for the effects of temperature changes on the particular gain-controlled amplifier being used and to provide the dynamic range for automatic gain control desired in any particular application. Thus, the gain-controlled amplifier 20 and the AGC detector and amplifier 22 are operated as a conventional AGC arrangement in various selected ambient temperatures with a minimum signal input (say 1 microvolt) to determine the change with temperature of the AGC voltage. That is to say, the change in the level of output of the AGC detector and amplifier 22 (FIG. 1) is determined over a desired temperature range with a minimum signal into such amplifer. At the same time, the change in forward bias of the diode D1 may be measured, or, when, as here, a type IN4148 diode is used, the characteristic sheet of the diode D1 may be consulted. The ratio of resistor R1 to resistor R2 is then set so that the change in the AGC voltage at the junction of resistors R1 and R2 equals the change in forward bias of the diode D1 over the selected temperature range. With the ratio of the resistors R1 and R2 so determined, the level of the voltage on the noninverting terminal "+" of the AGC scaling amplifier 22D (FIG. 2) is constant over the selected range of ambient temperatures when a minimum signal input (here 1 microvolt) is applied to the input terminal of the AGC detector and amplifier 22.

Having compensated for the effect of ambient temperature with a minimum sum signal input, it is next necessary to determine the effect of ambient temperature as the level of the sum signal input is changed and to compensate for the latter such effect by adjustment of R6. Thus, at the extremes of the range of ambient temperatures, and with maximum and minimum sum signal inputs, the change in the slope of the AGC slope, i.e. the ratio between decibels of compression and AGC voltage is determined. With transistor Q1 conducting, the effect of the change in ambient temperature on the resistance of that element is known. The series combination of resistor R6 and transistor Q1 therefore constitute a temperature-sensitive arrangement which causes the voltage on the inverting terminal (marked "−") of the AGC scaling amplifier 22D to change with temperature ultimately to cause the level of that amplifier to change in an opposite direction to the change in AGC slope. Resistor R6 then is adjusted so that the change in AGC slope is compensated.

Resistor R5 controls the feedback to the AGC scaling amplifier 22D in a conventional way to determine the change in the level of the output signal from that element in response to a given change in the level of the signal on the noninverting input terminal.

Resistor R3 determines the absolute level of the signal out of the AGC scaling amplifier 22D for a given minimum level of the sum input signal. For example, if the minimum level of the sum input signal is one microvolt and a one volt output signal is desired, resistor R3 may be adjusted as required to attain such condition.

Having described a preferred embodiment of this invention, it will now be apparent to one of skill in the art that the disclosed implementation may be changed in many ways without departing from the inventive concept of monitoring and evaluating any selected portion of a missile-borne radar receiver by compensating for the effect of changes in ambient temperature on elements in the selected portion. It is felt, therefore, that this invention should not be restricted to its disclosed embodiment, but rather should be limited only by the spirit and scope of the appended claims.

What is claimed is:

1. In a missile-borne receiver wherein an automatic gain control arrangement is used, temperature-compensated circuitry for producing a signal having a level proportional only to the level of the input to such arrangement, such circuitry comprising:
   (a) an operational amplifier having an input terminal, a feedback terminal and an output terminal;
   (b) input means for connecting the output signal of the automatic gain control arrangement to the input terminal, the impedance of such input means varying inversely with temperature over a predetermined range of temperature; and
   (c) feedback means for connecting the output terminal and the feedback terminal of the operational amplifier, the impedance of such feedback means varying directly with temperature over the predetermined range of temperatures.

2. Temperature-compensated circuitry as in claim 1 wherein the input means comprises:
   (a) a voltage divider connected between the output of the automatic gain control arrangement and ground; and
   (b) a solid state diode connected between a mode of the voltage divider and the input terminal, the change in the voltage at such node being equal to the change in forward bias of the solid state diode over the predetermined range of temperatures.

3. Temperature-compensated circuitry as in claim 1 wherein the feedback means comprises a variable resistor and a temperature-sensitive solid state device serially connected between the feedback terminal of the operational amplifier and ground.

4. Temperature-compensated circuitry as in claim 3 wherein the feedback means includes, additionally, a second variable resistor connected between the output and feedback terminals of the operational amplifier.

* * * * *